United States Patent [19]
Pfeiffer et al.

[11] Patent Number: 6,130,432
[45] Date of Patent: Oct. 10, 2000

[54] PARTICLE BEAM SYSTEM WITH DYNAMIC FOCUSING

[75] Inventors: Hans C. Pfeiffer, Ridgefield, Conn.; Joseph J. Senesi, Poughquag; Maris Andris Sturans, Wappingers Falls, both of N.Y.

[73] Assignee: International Business Machines Corporation, Armonk, N.Y.

[21] Appl. No.: 09/290,784

[22] Filed: Apr. 13, 1999

[51] Int. Cl.⁷ .................................................. H01J 37/147

[52] U.S. Cl. .............................. 250/396 ML; 250/492.23

[58] Field of Search ...................... 250/396 ML, 396 R, 250/398, 492.23

[56] References Cited

U.S. PATENT DOCUMENTS 4,544,846  10/1985  Langher et al. .................. 250/396 ML
4,977,324  12/1990  Kruit et al. ....................... 250/396 ML

*Primary Examiner*—Kiet T. Nguyen

[57] ABSTRACT

A magnetic lens having a lens bore for the passage of a particle beam includes a dynamic focus coil that is positioned outside the lens bore and within the pole piece that shapes the lens field, so that the magnetic flux lines from the dynamic focus coil all end on the pole pieces of the lens and the shape of the lens field between the pole pieces has its magnitude changed by the current passing through the dynamic focus coil, but the field shape is not changed, thus changing the focal plane of the beam without moving the beam transversely with respect to the system axis.

17 Claims, 6 Drawing Sheets

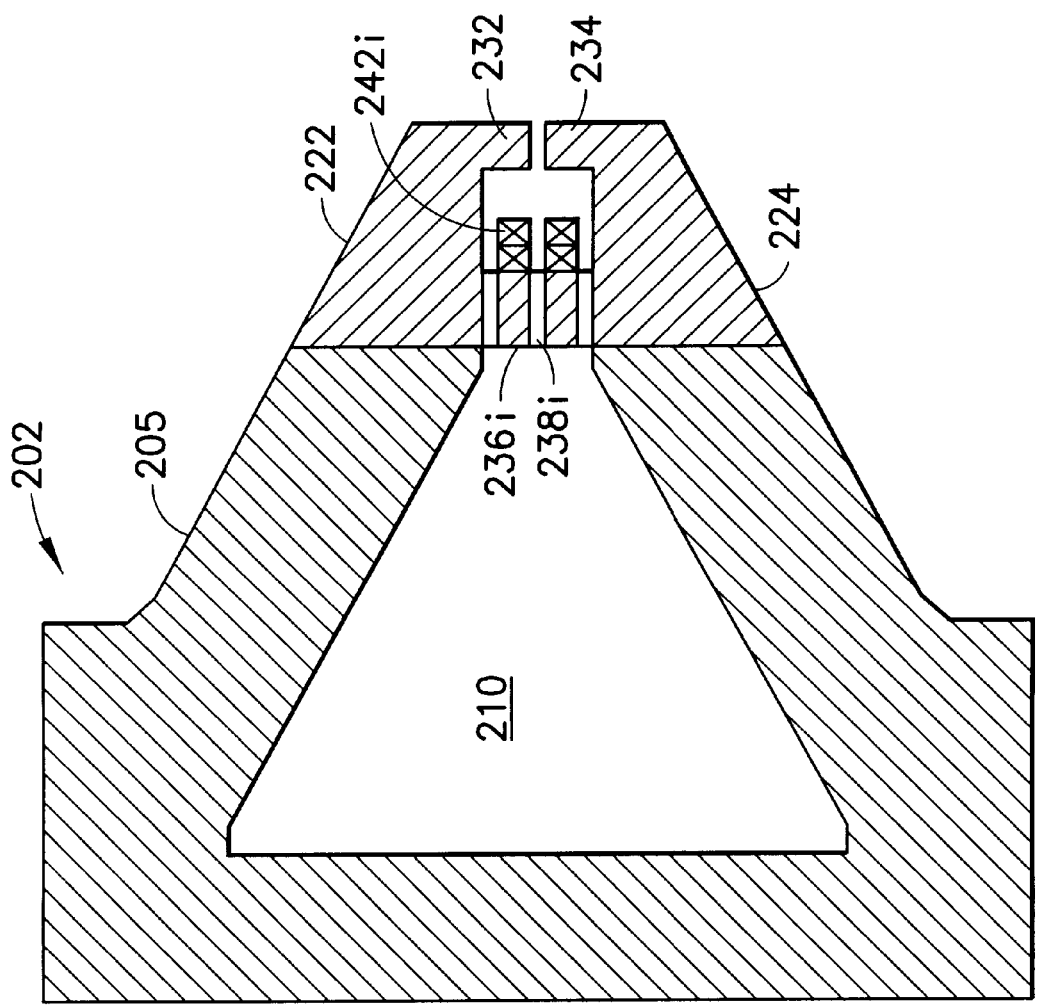

PARTICLE BEAM SYSTEM WITH DYNAMIC FOCUSING

FIELD OF THE INVENTION

The field of the invention is that of electron or other particle beam lithography.

RELATED INVENTIONS

This invention is related to the invention described in U.S. Pat. application Ser. No. 09/290,785, owned by the assignee of this application and filed concurrently herewith.

BACKGROUND OF THE INVENTION

Modern e-beam systems used to write reticles and to direct-write wafers are required to maintain the focus and positional accuracy of the beam at the target substrate to very high accuracy (<10 nm for a 4 GB DRAM reticle) over the entire substrate (commonly 6 in$^2$) for long periods of writing time (about 4 hours for the same reticle). As the substrate is mechanically moved under the beam from field to field, the height of the target may vary by a significant amount (several microns) which requires that the beam be refocused. This focus change must be accomplished at high speed without beam motion, which would spoil the location accuracy. The beam is typically centered in the main focus lenses, but their inductance is too high to be used for fast adjustment. Usually, a separate small, low inductance coil (referred to as a dynamic focus coil) is used to make these small focus corrections, but centering the dynamic focus coil to the beam axis is a very difficult task. Thus, to render the focus coil adjustment insensitive to coil position, the focus coil field that does the focus adjustment must not affect the beam position; i.e. must be centered with respect to the beam axis at all times and must have negligible hysteresis or eddy current effects.

An article in the IBM Technical Disclosure Bulletin in 1986 (Vol. 28, No. 8, January, 1986) suggests a method of placing a dynamic focus coil within the pole pieces of a magnetic lens that has not been adopted by the art. The present invention cures some flaws in that suggested solution.

SUMMARY OF THE INVENTION

The invention relates to a focus adjustment system including a dynamic focus coil positioned within the pole piece of a magnetic lens according to a positioning criterion and magnetically isolated from the excitation coil of the lens, whereby the shape of the magnetic field in the lens bore is determined solely by the geometry of the pole piece and the landing position of the beam is not affected by the addition of the field of the dynamic focus coil, since the beam is always centered in the lens.

A feature of the invention is that the position of the dynamic focus coil is not critical, provided that a simple criterion is satisfied. It can be placed in many locations within the pole pieces.

An optional feature of the invention is the positioning of the dynamic focus coil in a lens upstream from the final focus lens.

BRIEF DESCRIPTION OF THE DRAWINGS

FIGS. 4 and 5 illustrate alternative lens-coil configurations.

DESCRIPTION OF THE PREFERRED EMBODIMENT

Figure 1:
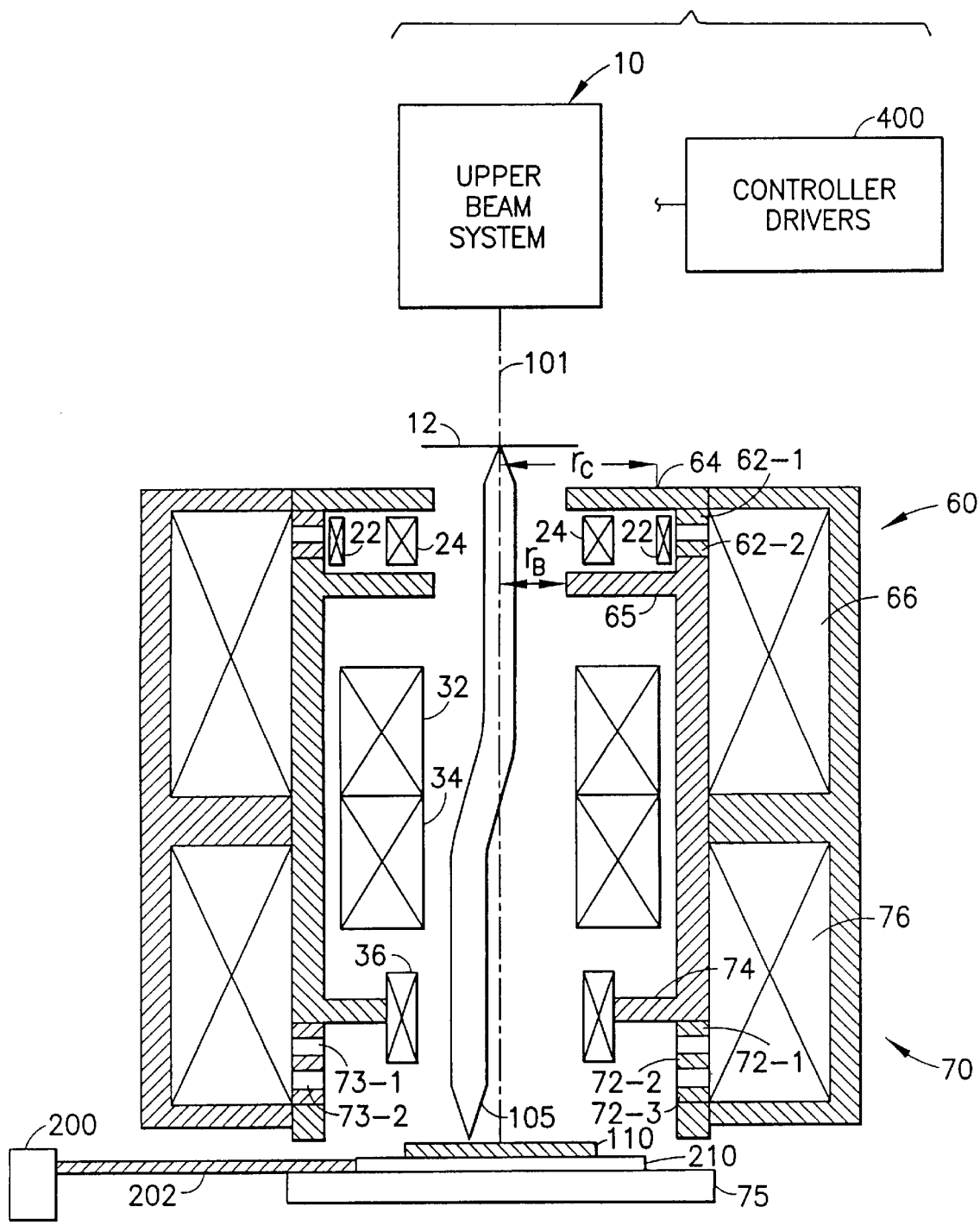
FIG. 1 illustrates, in partially pictorial, partially schematic style, an embodiment of the invention.

Referring now to FIG. 1, there is shown a portion of a system employing the invention. At the top center, beam 105 travels downwardly from an upper beam system 10 where the beam is generated and processed. Voltage and current drivers for the beam control elements, including a dynamic focus coil driver, together with a control system are schematically represented by box 400. Illustratively, the system is a "shaped beam" system, in which the beam, having been formed by two conjugate square apertures in upper beam system 10 to form any desired shape ranging from a thin line to a square having the dimensions of the aperture, is brought to an intermediate focus in object plane 12 of the projection system. The various elements, such as the electron gun, deflectors, etc. are represented schematically by a simple box 10, referred to as the upstream beam system. The image of a layer of an integrated circuit is formed on the wafer by stitching together the several shapes that make up the image. Such a system is conventionally used to write patterns on reticles, also.

The heavy shaded lines in the lower portion of the figure define a two-lens system (known as VAIL, Variable Axis Immersion Lens) in which the upper portion, denoted generally by the numeral 60, collimates the shaped beam and the lower portion, denoted generally by the numeral 70, focuses the collimated beam on wafer 110. Beam 105 is deflected in the x direction as shown and in the y direction (perpendicular to the plane of the drawing) to sweep out a raster. Preferably, but not essentially, the sweep in y covers the entire width of the chip. Drive 200, acting through rod 202, moves the chip in steps equal to a raster length along the x direction. Deflection in the x direction away from axis 101 and then parallel to it is performed by deflection yokes 32 and 34. Yokes generate fields that are in the x-y plane and thus are not relevant to the field from the pole pieces. Counterpart deflection yokes for deflecting in the y direction are in front of or in back of the plane of the paper and are omitted from the figure for clarity.

At the bottom of the figure, lens 70 focuses the beam. Within lens 70, variable axis yoke 36 generates a horizontal field that cancels the radial component of the lens field at the location of beam 105. The axis of the magnetic field thus follows the axis of the beam to practically eliminate all deflection aberrations.

At the very bottom of the figure, plate 75 completes the magnetic circuit of lens 70, so that wafer 110 is immersed in the field, hence the term immersion lens. Those skilled in the art will appreciate that other lens configurations may be used with the invention.

Between pole pieces 64 and 65 of lens 60 at the top of the figure, dynamic stigmator 24 applies horizontal fields from eight coils that correct for astigmatism. Since the stigmator fields are horizontal, they will affect beam shape and position. The induced position errors will have been corrected for in system setup and do not affect the operation of the present invention. Dynamic focus coil 22 applies an additional field to move the focal plane of lens 70 up or down along the system axis 101. One skilled in the art would ordinarily think of applying the focus correction close to the lens that performs the focus operation. For the reasons set forth below, focus coil 22 is able to do this without affecting the position of beam 105 on target 110.

Figure 2:
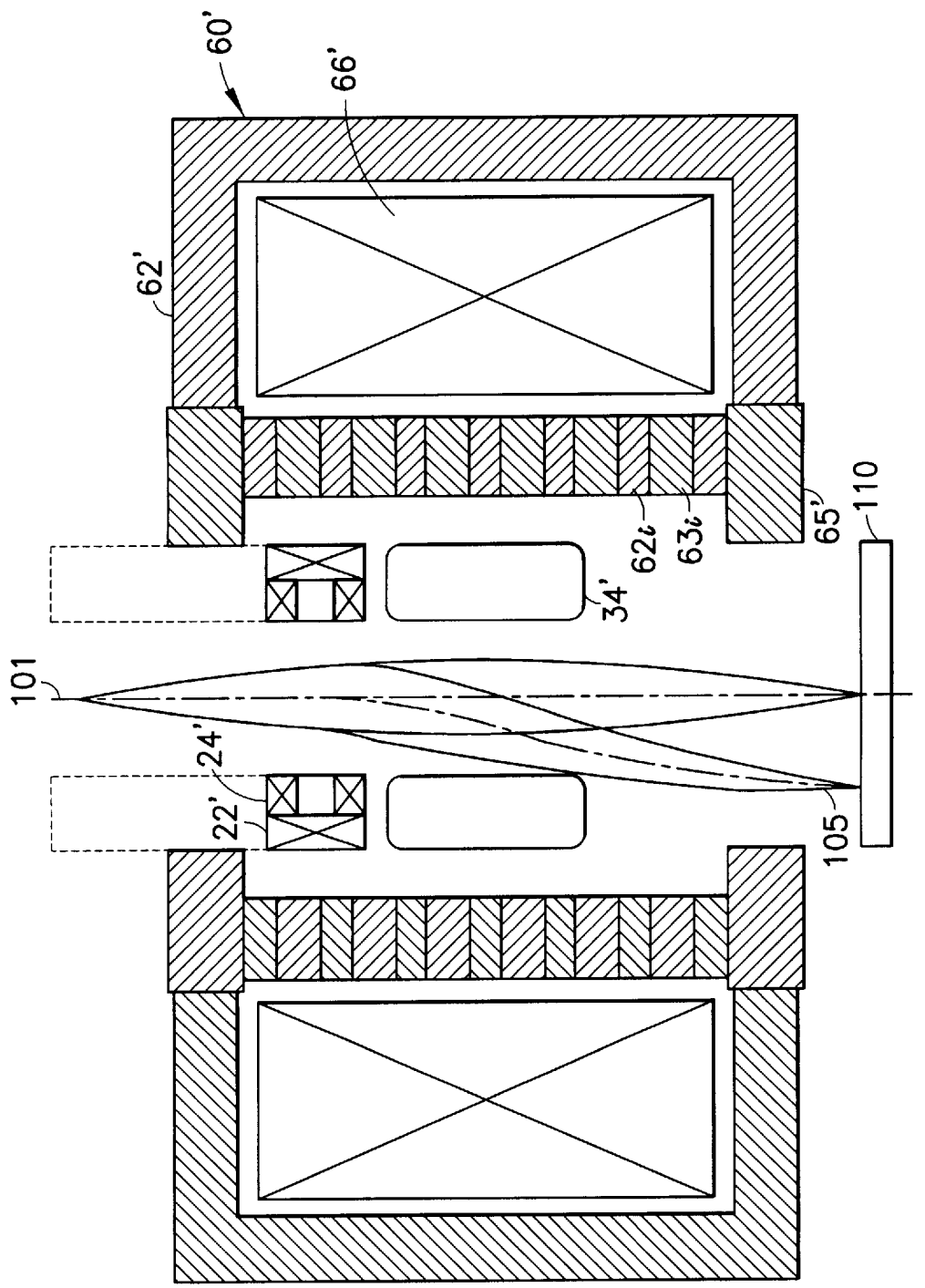
FIG. 2 illustrates a prior art lens.

Referring now to FIG. 2, there is shown a prior art lens 60' that has an additional feature in common with lenses 60 and 70. Pole piece 64' at the top of the figure, and pole piece 65' at the bottom of the figure determine the shape of the field in the region between them. The terminology used herein is that the overall structure of lens 60' will be referred to as the lens frame (which may be partly steel and partly ferrite) and the individual elements 64' and 65' will be referred to as the pole pieces. As is known in the art, the pole pieces are made of ferrite and are separated by alternating pieces of ferrite $62_i'$ and non-magnetic insulator $63_i'$, illustratively $NF_6$. Ferrite is a composite material comprising magnetically permeable grains (e.g. iron filings) separated by and embedded in an insulator, such as MN60, available from Ceramic Magnetics of Fairfield, N.J. The separation of the grains makes ferrite a poor electrical conductor and thereby reduces the effect of eddy currents. The alternation of ferrite and insulator both breaks the magnetic flux lines and also isolates excitation coil 66' from the other coils disposed between pole pieces 64' and 65'. This compact geometric arrangement prevents coupling between the main lens coil 66' and the small coils 24', 22' and 34', which would interfere with the proper operation of the system. Stigmator 24' is an air-core saddle coil that produces a deflection field (by definition, generally horizontal) that corrects for astigmatism at the target. Dynamic focus coil 22' is an air-core helical coil that produces a focus field (by definition, generally vertical) that adds to the magnitude of the field of lens 60 without changing its shape.

In this prior art arrangement, coils 22', 24' and 34' were all sized to fit within the bore of pole pieces 64' and 65', as is indicated by the vertical dotted lines. This was done so that the smaller coils could be inserted and removed without disturbing lens 60'. The location of coil 22' permitted some flux from coil 22' to reach the beam directly, rather than to merely increase the magnitude of the field defined by pole pieces 64' and 65'. The field from coil 22' had to affect the beam in order to change the focus, of course, but this prior art configuration had the undesired effect that the inevitable errors in position of coil 22' (i.e. being non-concentric with pole pieces 64' and 65') would change the centering of the field from coil 22' and the beam and would thus deflect the beam at the target when coil 22' was energized. This interaction has been an inconvenience in the prior art and it has been necessary until now to "learn" the amount of beam shift when the dynamic focus coil is applied and to correct for that shift with deflectors. This adds complexity to system operation and inevitably introduces errors.

Referring now again to FIG. 1, there is shown dynamic focus coil 22 and stigmator 24, corresponding in function but not result to their counterparts in FIG. 2. Coil 22 is now positioned within the area between pole pieces 64 and 65 such that all the field lines from the coil that cause the beam to refocus close on the main lens pole pieces, so that the effect of coil 22 is to increase the field strength in the region between pole pieces 64 and 65, without affecting the shape of that field. Since lens 60 is run high on the hysteresis curve of the ferrite pole piece and since ferrite is a poor conductor, the effect of hysteresis and eddy currents on the beam position on wafer 110 is negligible (less than 2 nm in the illustrative system).

According to the invention, in a configuration such as that illustrated in FIG. 1, referred to as a "small-gap" lens (the gap being comparable to the bore diameter), the inner radius $r_C$ of the dynamic focus coil should be more than twice the radius $r_B$ of the lens bore ($r_C \geq 2r_B$). If this simple criterion is satisfied, the coil may be placed anywhere within the lens gap and need not be centered on the system axis. In the case of a "large-gap" lens such as that illustrated in FIG. 2, the criterion is that the radius of the coil be greater than the radius of the lens bore ($r_C > r_B$) and that the length h of the coil along the system axis be less than the difference between the coil radius and the bore radius, $h < (r_C - r_B)$. If the coil is not centered, then the smallest distance between the axis and the coil is substituted for the coil radius in the criterion.

The IBM Technical Disclosure Bulletin reference did not disclose either geometrical criterion and, as can be seen from the drawings, taught away from it. That suggested approach has not been used by its authors in the intervening period. Only with the present invention has the benefit of location-insensitive dynamic focus coils been achieved.

The test of coil-beam interaction is conceptually simple. Turn on the coil and see if the beam position on the wafer changes by more than the error budget. In the illustrative system, where the lens field has a magnitude of about 800 gauss and the field of coil 22 has a magnitude of about 20 gauss, the deflection of the landing point of beam 105 on the wafer is typically <2 nm.

Figure 4:
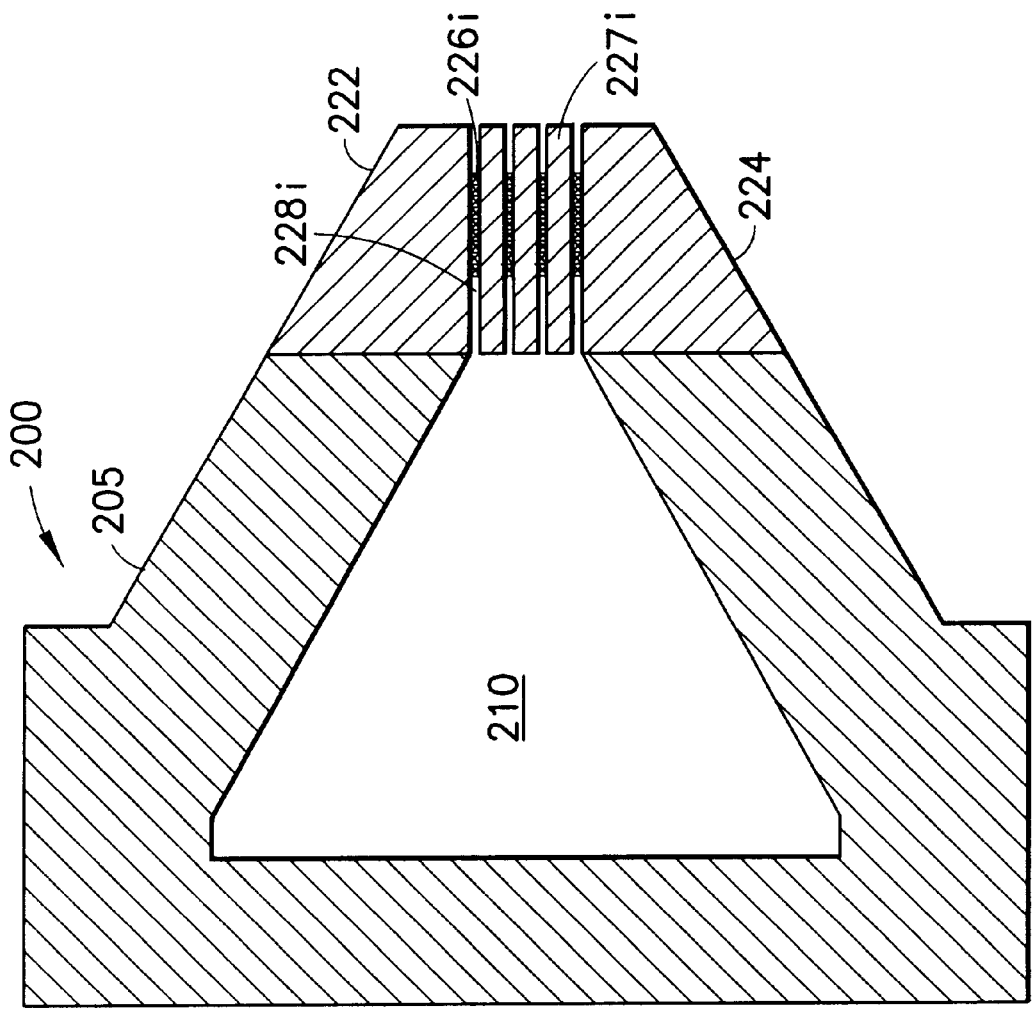

Referring now to FIG. 4, there is shown an alternative lens structure employing the invention. Lens 200 employs a coil 210, set in a steel frame 205. The roughly triangular cross section is not important to lens operation and other shapes could be chosen. Pole pieces 222 and 224 are formed from ferrite and are separated by layers of ferrite $227_i$ alternating with layers of insulator $228_i$. A set of generally planar dynamic focus coils $226_i$ are embedded within the insulator layers. Coils 226 will be wound with a few or only one layer of windings, depending on the speed requirements and the allowable inductance. This embodiment is directed at a system requiring high speed focal change, on the order of 30 nsec and the coils 226 have on the order of 10 turns, in contrast to a system as illustrated in FIG. 1, in which the response time may be on the order of 1 μsec and the coils have about 500 turns. Referring now to FIG. 5, there is shown a lens configuration generally similar to that of FIG. 4, in which a set of four coils $242_i$, each similar to coil 22, is disposed within a pole piece cavity between pole tips 232 and 234 and alternating ferrite layers $236_i$ and insulator layers $238_i$. Since the dynamic focus coils are effectively embedded within the pole tips in the embodiments of FIGS. 4 and 5, the positioning criterion above does not apply.

Preferably, the several coils 226 or 242 can be separately driven, giving the system designer the option of driving one or a few coils with a larger current or a greater number of coils with a smaller current. An additional advantage of such an arrangement is redundancy. A defective coil can be substituted by increased current in other coils, so the system need not be disassembled if one coil fails. The need for lens disassembly if a coil fails is a drawback of the arrangement shown in FIG. 1, in which a single coil is disposed at a larger radius than the lens bore.

Figure 6A:
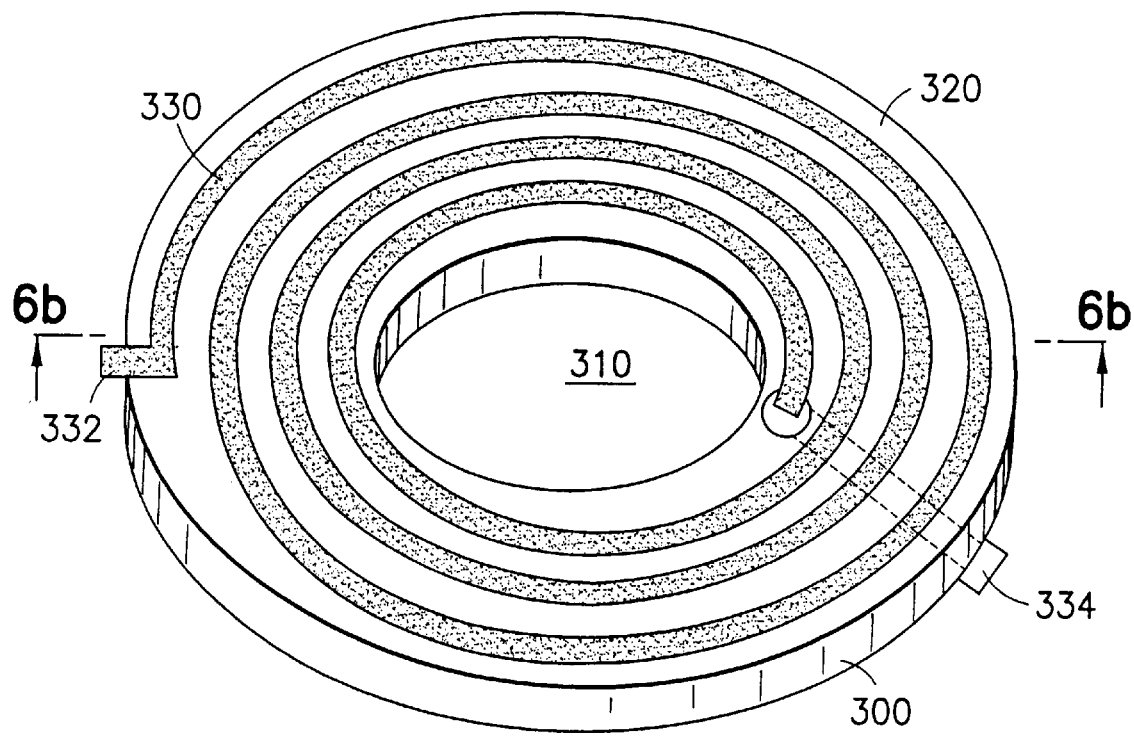
FIGS. 6a and 6b illustrate an alternative embodiment.
Figure 6B:
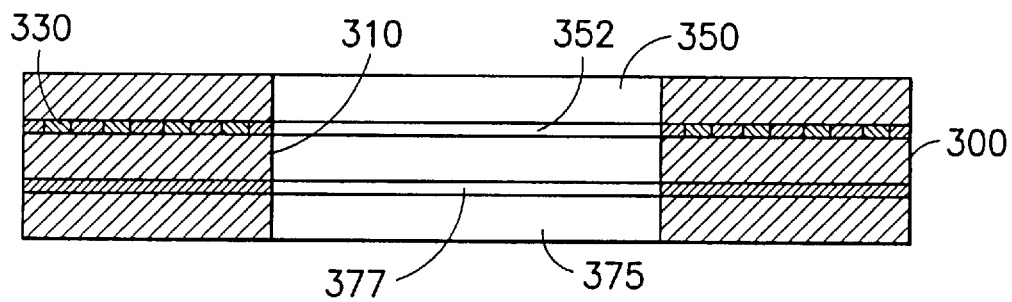

FIG. 6a illustrates an implementation 300 of the generally planar coils $226_i$, in which substrate 320 both supports coil 330 and provides the function of insulator $228_i$. The single layer coil 330 is illustratively formed according to standard printed circuit board techniques, with a first connecting tab 332 on the top surface of substrate 320 and a second connecting tab 334 on the bottom surface, connected to the end of coil 330 through via 335. FIG. 6b illustrates a cross section through lines B—B in FIG. 6a of a 'sandwich' comprising coil 330 (shown for purposes of illustration as having four turns) together with upper and lower insulating layers 350 and 375 and bonding layers 352 and 377 that bond the three insulators together and fill the gap around the conductive sheets. In the center, lens bore aperture 310 having a diameter greater than the lens bore by some tolerance permits the passage of the beam.

Figure 3:
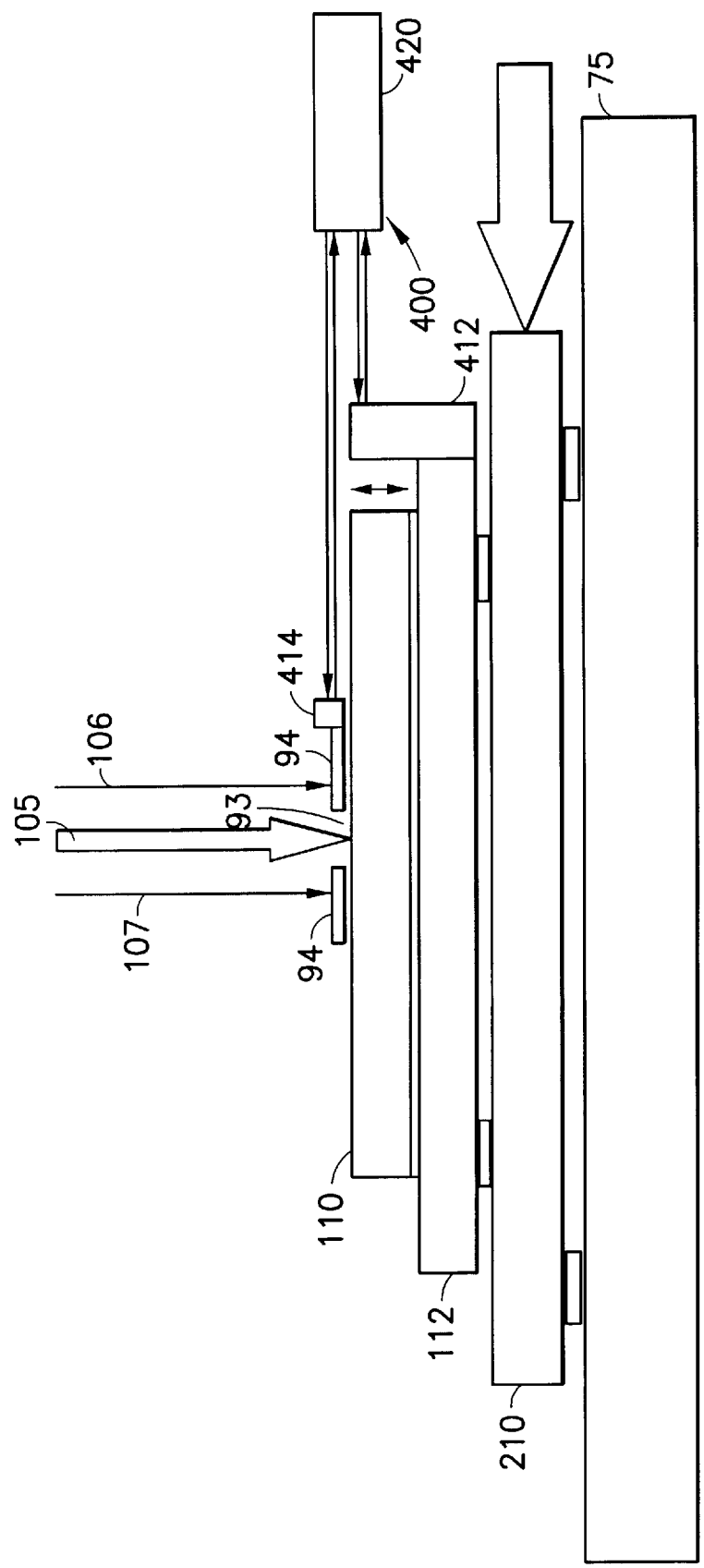
FIG. 3 illustrates, in partially pictorial, partially schematic style, a system including a reference fixture that makes use of the invention.

Referring now to FIG. 3, there is shown a detail of the system in FIG. 1, with the upper portions removed for clarity. To maintain the position accuracy of the beam relative to the substrate, a promising approach is that of in-situ registration, in which the beam is periodically scanned over mechanically stable reference marks, without any motion of the stage. The reference marks must be out of the plane of the target by a considerable amount, about several millimeters. Such a distance is far greater than the depth of focus of particle beams, so the beam must be refocused without disturbing the position of the beam. Beam 105 is shown as a heavy line striking wafer 110 and beam 106 and 107 striking alignment fixture 94 shown as lighter lines. This alignment fixture is mounted on a stable platform not shown and has a rectangular aperture 93 through which beam 105 passes. Outside the aperture, four registration marks are made in fixture 94 near the corners of the aperture. As often as required, perhaps on every stripe of the raster pattern, the beam is deflected in the x and y directions to the registration marks.

The position of the beam on the target fixture is measured by conventional detectors not shown and the position of the fixture with respect to carrier 112, resting on stage 210 that supports wafer 110 is measured by a conventional laser measurement apparatus 400 comprising mirrors 414 and 412 on the stationary and moving mechanical fixtures and comparison unit 420 that generates, detects and analyses a laser beam. The result of the comparison is update information relating the actual position of the beam with respect to the substrate.

The focus adjustment system is also used for routine focus adjustment during operation. The height of the top surface of target 110 will change as it is mechanically moved and dynamic coil 22 can be used to provide focus adjustment in response to data from sensors measuring the actual height of target 110.

While the invention has been described in terms of a set of preferred embodiments, those skilled in the art will recognize that the invention can be practiced in various versions within the spirit and scope of the following claims. For example, the focus coil may be placed in any convenient lens, such as the final focus lens. Further, more than one focus correction coil may be used within a system. If space or thermal constraints cause difficulty, the focus correction may be provided by two even or more coils. Also, there may be more than one focal plane that is adjusted, e.g. the invention might by used for an intermediate focal plane as well as the final one.

We claim:

1. A magnetic lens comprising:
    a magnetically permeable frame enclosing a lens excitation coil and comprising first and second pole pieces for shaping a lens field, said first and second pole pieces being disposed about a lens bore having a lens bore radius;
    at least one dynamic focus coil disposed within said pole piece about said lens bore and having an inner coil radius greater than or equal to twice said lens bore radius, whereby current passing through said dynamic focus coil changes only the magnitude of said lens field between said first and second pole pieces.

2. A lens according to claim 1, in which said at least one coil comprises at least two coils electrically isolated from one another, whereby said at least two coils may be separately driven.

3. A lens according to claim 1, in which said at least one coil comprises a generally planar coil disposed about a lens bore aperture in a first insulating substrate.

4. A lens according to claim 3, in which said generally planar coil is separated from an adjoining layer of magnetic material by a second insulator.

5. A lens according to claim 3, in which a set of at least two generally planar coils are separated from one another and from an adjoining layer of magnetic material by a set of insulating layers.

6. A magnetic lens comprising:
    a magnetically permeable frame enclosing a lens excitation coil and comprising first and second pole pieces for shaping a lens field, said first and second pole pieces being disposed about a lens bore having a lens bore radius;
    at least one dynamic focus coil disposed within said pole piece about said lens bore, having an inner coil radius greater than said lens bore radius and a coil length along a system axis less than the difference between said inner coil radius and said lens bore radius, whereby current passing through said dynamic focus coil changes only the magnitude of said lens field between said first and second pole pieces.

7. A lens according to claim 6, in which said at least one coil comprises at least two coils electrically isolated from one another, whereby said at least two coils may be separately driven.

8. A magnetic lens comprising:
    a magnetically permeable frame enclosing a lens excitation coil and comprising a pole piece having first and second pole pieces for shaping a lens field, said first and second pole pieces being disposed about a lens bore having a lens bore radius;
    first and second pole tips disposed on facing surfaces of said pole pieces and forming a pole piece cavity between said pole pieces and outside said lens bore; and
    at least one dynamic focus coil disposed within said pole piece about said lens bore and having an inner coil radius greater than said lens bore radius, whereby current passing through said dynamic focus coil changes only the magnitude of said lens field between said first and second pole pieces.

9. A magnetic lens according to claim 8, in which said at least one coil comprises at least two coils electrically isolated from one another, whereby said at least two coils may be separately driven.

10. An e-beam system comprising:
    an upstream beam system disposed along a system axis for generating an electron beam;
    a set of beam deflectors for directing said beam along a desired path;
    a set of at least one magnetic lenses for focusing said beam, at least one of which lenses contains first and second pole pieces of ferromagnetic material, disposed about said system axis and having a lens bore, said lens bore having a lens bore radius permitting the passage of said beam therethrough, and at least one dynamic focus coil, disposed about said lens bore, within said pole piece, and having an inner coil radius greater than or equal to twice said lens bore radius, whereby current passing through said dynamic focus coil changes only the magnitude of a lens field between said first and second pole pieces;

a set of drivers for driving said sets of magnetic lenses, deflectors and coils under control of a system controller, in which;

said set of drivers generates a first set of currents that cause said set of lenses to focus said beam in a first workpiece plane disposed at a first workpiece location along said system axis; and said set of drivers includes a dynamic focus coil driver for driving said dynamic focus coil with a focus coil current when said first set of currents is applied to said set of lenses, whereby said beam is focused in a second workpiece plane disposed at a second workpiece location along said system axis different from said first workpiece location.

11. A system according to claim 10, in which said set of at least one lenses comprises at least a first lens in which said at least one dynamic focus coil comprises a generally planar coil disposed about a lens bore aperture in a first insulating substrate.

12. A system according to claim 11, in which said generally planar coil is separated from an adjoining layer of magnetic material by a second insulating layer.

13. A system according to claim 12, in which a set of at least two generally planar coils are separated from one another and from an adjoining layer of magnetic material by a set of insulating layers.

14. A system according to claim 10, in which said at least one lens has a magnetically permeable frame enclosing a lens excitation coil and comprising first and second pole pieces for shaping a lens field, said first and second pole pieces being disposed about a lens bore having a lens bore radius;

first and second pole tips disposed on facing surfaces of said pole pieces and forming a pole piece cavity between said pole pieces and outside said lens bore; and at least one dynamic focus coil disposed within said pole piece cavity and having an inner coil radius greater than said lens bore radius, whereby current passing through said dynamic focus coil changes only the magnitude of said lens field between said first and second pole pieces.

15. A system according to claim 14, in which a set of at least two dynamic focus coils are disposed within said pole piece.

16. A system according to claim 10, in which said set of at least one lenses comprises at least a first lens for collimating a beam emerging from an object plane substantially along a system axis and a second lens for focusing said beam on said workpiece; and said dynamic focus coil is disposed within said pole piece of said first lens.

17. A system according to claim 10, in which said upstream beam system includes an upstream set of at least one lenses comprising at least a first lens for operating on a beam emerging from a beam source substantially along a system axis and a second lens for focusing said beam on an intermediate focal plane; and a second dynamic focus coil is disposed within pole pieces of said at least one lens.

\* \* \* \* \*